United States Patent
Das et al.

(10) Patent No.: US 9,275,282 B2
(45) Date of Patent: Mar. 1, 2016

(54) PROCESSING AND MANAGING MULTIPLE MAPS FOR AN LCI

(71) Applicant: QUALCOMM Incorporated, San Diego, CA (US)

(72) Inventors: Saumitra Mohan Das, Santa Clara, CA (US); Abhinav Sharma, Santa Clara, CA (US); Chandrakant Mehta, Santa Clara, CA (US); Hui Chao, San Jose, CA (US); Behrooz Khorashadi, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 363 days.

(21) Appl. No.: 13/679,747

(22) Filed: Nov. 16, 2012

(65) Prior Publication Data

US 2014/0119674 A1 May 1, 2014

Related U.S. Application Data

(60) Provisional application No. 61/720,308, filed on Oct. 30, 2012.

(51) Int. Cl.
| | |
|---|---|
| *G06K 9/46* | (2006.01) |
| *G06K 9/50* | (2006.01) |
| *G06K 9/00* | (2006.01) |
| *G01C 21/20* | (2006.01) |
| *G06F 17/50* | (2006.01) |

(52) U.S. Cl.
CPC .......... *G06K 9/00483* (2013.01); *G01C 21/206* (2013.01); *G06F 17/5004* (2013.01); *G06K 9/00476* (2013.01)

(58) Field of Classification Search
CPC ............ G06F 17/30061; G06F 17/30241; G06T 15/10; G06T 19/00; G06T 2210/04; G06T 2219/004; G06T 7/60
See application file for complete search history.

(56) References Cited

U.S. PATENT DOCUMENTS

| | | | |
|---|---|---|---|
| 6,134,338 A | 10/2000 | Solberg et al. | |
| 6,556,878 B1 | 4/2003 | Fielding | |
| 7,605,696 B2 | 10/2009 | Quatro | |
| 7,724,242 B2 | 5/2010 | Hillis et al. | |
| 8,014,796 B2 | 9/2011 | Boudreau et al. | |
| 8,217,771 B2 | 7/2012 | Chen et al. | |
| 8,219,318 B2 | 7/2012 | Kreft | |
| 8,812,015 B2 | 8/2014 | Das et al. | |
| 2002/0035408 A1 | 3/2002 | Smith | |
| 2003/0004693 A1 | 1/2003 | Neiman et al. | |
| 2004/0177085 A1* | 9/2004 | Rappaport et al. | 707/101 |

(Continued)

OTHER PUBLICATIONS

Loulier (Using smartphones for indoor navigation, 2011, Published master's thesis, Purdue University).*

(Continued)

*Primary Examiner* — Stephen R Koziol
*Assistant Examiner* — Jonathan S Lee
(74) *Attorney, Agent, or Firm* — Silicon Valley Patent Group LLP

(57) ABSTRACT

Systems, apparatus and methods for merging maps used by a positioning server are presented. Original maps are overlaid, concatenated or inset to create a more detailed map. The original maps are from different sources and/or in different formats. By merging or fusing maps together, a positioning server may create a better structural map, which is in turn used to create improved positioning assistance data.

30 Claims, 4 Drawing Sheets

(56) References Cited

U.S. PATENT DOCUMENTS

| | | | |
|---|---|---|---|
| 2005/0115166 A1* | 6/2005 | Miller | E04H 1/04 52/79.1 |
| 2007/0136026 A1* | 6/2007 | Heap | 702/150 |
| 2007/0162485 A1 | 7/2007 | Haeberle et al. | |
| 2009/0216438 A1* | 8/2009 | Shafer | 701/210 |
| 2010/0021012 A1* | 1/2010 | Seegers et al. | 382/113 |
| 2010/0138762 A1 | 6/2010 | Reghetti et al. | |
| 2010/0223032 A1 | 9/2010 | Reghetti et al. | |
| 2010/0328093 A1 | 12/2010 | Robinson et al. | |
| 2011/0082638 A1 | 4/2011 | Khorashadi et al. | |
| 2011/0085707 A1 | 4/2011 | Gupta et al. | |
| 2011/0172906 A1 | 7/2011 | Das et al. | |
| 2011/0280453 A1* | 11/2011 | Chen et al. | 382/113 |
| 2012/0020533 A1 | 1/2012 | Liu et al. | |
| 2012/0029817 A1 | 2/2012 | Khorashadi et al. | |
| 2012/0066275 A1* | 3/2012 | Gerstner | G06F 17/300614 707/825 |
| 2012/0165069 A1 | 6/2012 | Jung et al. | |
| 2012/0253751 A1* | 10/2012 | Malka et al. | 703/1 |
| 2013/0338969 A1* | 12/2013 | Landes | E04B 1/343 703/1 |
| 2014/0095122 A1 | 4/2014 | Appleman et al. | |
| 2014/0142895 A1 | 5/2014 | Sharma et al. | |

OTHER PUBLICATIONS

International Search Report and Written Opinion—PCT/US2013/063296—ISA/EPO—Feb. 27, 2014.

Das S.M., et al., "Studying Wireless Routing Link Metric Dynamics", IMC Oct. 2007, ACM 978-1-59593-908, pp. 1-6.

Zhi G.S., et al., "A Graph-Based Algorithm for Extracting Units and Loops from Architectural Floor Plans for a Building Evacuation Model" Computer-Aided Design 35, pp. 1-14, 2003.

* cited by examiner

PROCESSING AND MANAGING MULTIPLE MAPS FOR AN LCI

CROSS-REFERENCE TO RELATED APPLICATIONS

This application claims the benefit of and priority under 35 U.S.C. §119(e) to U.S. Provisional Application No. 61/720,308, filed Oct. 30, 2012, titled "Processing and managing multiple maps for an LCI" and which is incorporated herein by reference.

This application is related to U.S. patent application Ser. No. 13/679,740 entitled "Extracting and inferring map metadata from architectural diagrams" filed Nov. 16, 2012, and which is incorporated herein by reference.

BACKGROUND

I. Field of the Invention

This disclosure relates generally to apparatus and methods for position estimation of wireless terminals, and more particularly to generating positioning assistance data from multiple LCI maps.

II. Background

Building maps inform a user the location of walls, room, entrances, stairs, elevators, rooms, portals and the like. A positioning engine may use these building maps to determine where and how a particle, that is, a mobile phone, may move through a building. A navigation engine may use the building map to define a particle map having boundaries for inertial navigation thereby creating RF heat models for RF propagation. As a result, particle maps from building maps lead to improved positioning estimates.

Maps for a common venue may come from multiple sources and include different types of information. Various sources of original maps supply competing or similar maps of common venues. For example, multiple maps may provide drawings of a particular indoor mall. A first map may include an outline of shops and stores within an indoor mall with each shop and store being labeled. A second map may include interior walls of the indoor mall. A third map may include structural walls and supports of the mall. The various maps may serve different purposes. For example, one map may provide routing, another map may provide points of interest (POI), a third map architectural structure, a fourth map may provide topology, and so on. Some maps are from one or more computer aided design (CAD) files. For example, a CAD file from a facilities manager may show furniture and room numbers, while an architect's CAD file shows a building's footprint, structure and support walls without furniture.

Sometimes a larger building is split into two or more adjacent maps where different floors and/or wings are sections of a building each having its own maps. As an example, a CAD file exists for the East wing first floor of a building while another CAD file exists for the West wing first floor and yet another CAD file exists for a second floor of the same building.

Such maps may of an entire building or a distinguishable logical section of a building (e.g., a single wing or floor) may be referred to as location content. The location content may be indexed or referred to at a location context identifier (LCI). A first LCI may index an entire floor of a particular building (e.g., a first map 110). A second LCI may index a second floor of the particular building (e.g., a second map 120). A set of LCIs may index various wings of a different building. Therefore, some buildings have a single LCI indexing a single floor plan while other buildings have multiple LCIs each corresponding to a different logical section of the building. Still other buildings have no LCI index to a floor plan.

What is needed is a means to merge these similar and adjacent maps of a common venue into an overall robust and complete merged map that better defines an area. A better define LCI allows improved prediction of how a particle may move within and between such maps and how RF signals propagate from access points. These maps result in positioning assistance data for a mobile device that better allows for a more accurate positioning estimate.

BRIEF SUMMARY

Disclosed are systems, apparatus and methods for merging maps used by a positioning server. Maps are overlaid, concatenated or inset to create a more detailed map than the separate maps. By merging or fusing maps together, a positioning server may create a better structural map, which is in turn used to create improved positioning assistance data. That is, merging and fusing overlaying or adjoining maps together results in a single map that a positioning server may use for generating positioning assistance data.

According to some aspects, disclosed is a method for merging maps used by a positioning server, the method comprising: receiving a first map in a first format; receiving a second map in a second format, wherein the first map and the second map are related; scaling, rotating and aligning the first map relative to the second map; extracting similarities between the first map and the second map to form a merged map.

According to some aspects, disclosed is a device for merging maps use by a positioning server, the device comprising: means for receiving a first map in a first format; means for receiving a second map in a second format, wherein the first map and the second map are related; means for scaling, rotating and aligning the first map relative to the second map; means for extracting similarities between the first map and the second map to form a merged map.

According to some aspects, disclosed is a device for merging maps used by a positioning server, the device comprising a processor and a memory wherein the memory includes software instructions for: receiving a first map in a first format; receiving a second map in a second format, wherein the first map and the second map are related; scaling, rotating and aligning the first map relative to the second map; extracting similarities between the first map and the second map to form a merged map.

According to some aspects, disclosed is a non-volatile computer-readable storage medium including program code stored thereon for merging maps used by a positioning server, the non-volatile computer-readable storage medium comprising program code for: receiving a first map in a first format; receiving a second map in a second format, wherein the first map and the second map are related; scaling, rotating and aligning the first map relative to the second map; extracting similarities between the first map and the second map to form a merged map.

It is understood that other aspects will become readily apparent to those skilled in the art from the following detailed description, wherein it is shown and described various aspects by way of illustration. The drawings and detailed description are to be regarded as illustrative in nature and not as restrictive.

BRIEF DESCRIPTION OF THE DRAWING

Embodiments of the invention will be described, by way of example only, with reference to the drawings.

DETAILED DESCRIPTION

Figure 1:
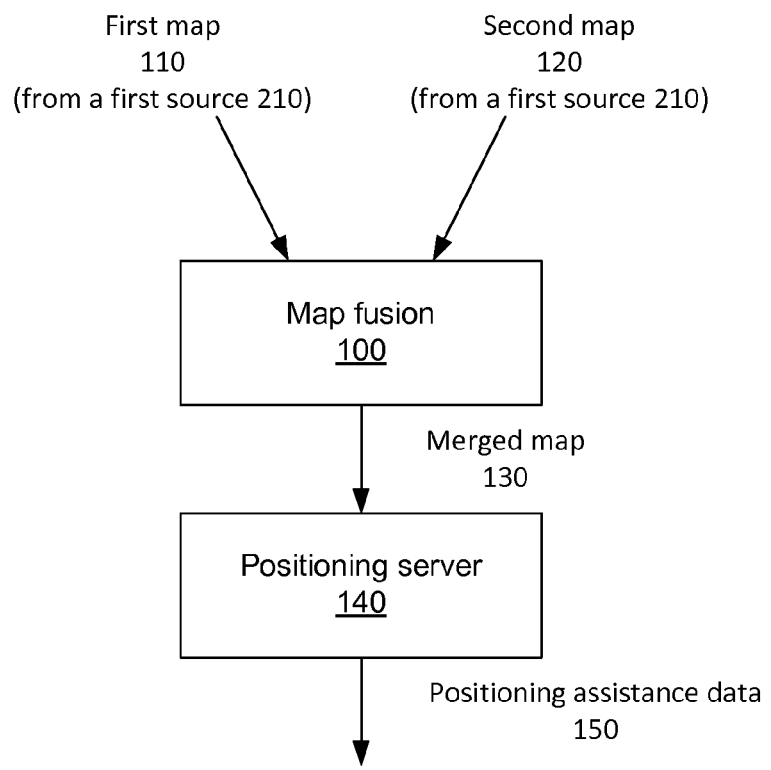
FIG. 1 illustrates fusing maps together for a positioning server to generate better assistance data, in accordance with some embodiments of the present invention.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for the purpose of providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the disclosure.

Position determination techniques described herein may be implemented in conjunction with various wireless communication networks such as a wireless wide area network (WWAN), a wireless local area network (WLAN), a wireless personal area network (WPAN), and so on. The term "network" and "system" are often used interchangeably. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, Long Term Evolution (LTE), and so on. A CDMA network may implement one or more radio access technologies (RATs) such as cdma2000, Wideband-CDMA (W-CDMA), and so on. Cdma2000 includes IS-95, IS-2000, and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may be an IEEE 802.11x network, and a WPAN may be a Bluetooth network, an IEEE 802.15x, or some other type of network. The techniques may also be implemented in conjunction with any combination of WWAN, WLAN and/or WPAN.

A satellite positioning system (SPS) typically includes a system of transmitters positioned to enable entities to determine their location on or above the Earth based, at least in part, on signals received from the transmitters. Such a transmitter typically transmits a signal marked with a repeating pseudo-random noise (PN) code of a set number of chips and may be located on ground based control stations, user equipment and/or space vehicles. In a particular example, such transmitters may be located on Earth orbiting satellite vehicles (SVs). For example, a SV in a constellation of Global Navigation Satellite System (GNSS) such as Global Positioning System (GPS), Galileo, GLONASS or Compass may transmit a signal marked with a PN code that is distinguishable from PN codes transmitted by other SVs in the constellation (e.g., using different PN codes for each satellite as in GPS or using the same code on different frequencies as in GLONASS). In accordance with certain aspects, the techniques presented herein are not restricted to global systems (e.g., GNSS) for SPS. For example, the techniques provided herein may be applied to or otherwise enabled for use in various regional systems, such as, e.g., Quasi-Zenith Satellite System (QZSS) over Japan, Indian Regional Navigational Satellite System (IRNSS) over India, Beidou over China, etc., and/or various augmentation systems (e.g., an Satellite Based Augmentation System (SBAS)) that may be associated with or otherwise enabled for use with one or more global and/or regional navigation satellite systems. By way of example but not limitation, an SBAS may include an augmentation system(s) that provides integrity information, differential corrections, etc., such as, e.g., Wide Area Augmentation System (WAAS), European Geostationary Navigation Overlay Service (EGNOS), Multi-functional Satellite Augmentation System (MSAS), GPS Aided Geo Augmented Navigation or GPS and Geo Augmented Navigation system (GAGAN), and/or the like. Thus, as used herein an SPS may include any combination of one or more global and/or regional navigation satellite systems and/or augmentation systems, and SPS signals may include SPS, SPS-like, and/or other signals associated with such one or more SPS.

As used herein, a mobile device, sometimes referred to as a mobile station (MS) or user equipment (UE), such as a cellular phone, mobile phone or other wireless communication device, personal communication system (PCS) device, personal navigation device (PND), Personal Information Manager (PIM), Personal Digital Assistant (PDA), laptop or other suitable mobile device which is capable of receiving wireless communication and/or navigation signals. The term "mobile device" is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, "mobile station" is intended to include all devices, including wireless communication devices, computers, laptops, etc. which are capable of communication with a server, such as via the Internet, WiFi, or other network, and regardless of whether satellite signal reception, assistance data reception, and/or position-related processing occurs at the device, at a server, or at another device associated with the network. Any operable combination of the above are also considered a "mobile device."

By way of initial example, a mobile device may determine that it is currently in a particular indoor region. Such a first estimated location may in certain instances be a rough location estimate. A mobile station may transmit this location estimate as a request to a location server. The location server may respond with a location context identifier (LCI) and positioning assistance data. An LCI may include a map for a particular venue, such as a shopping mall. For example, a first estimated location may indicate that a mobile device may be located near to a particular shopping mall LCI and the positioning assistance data may relate to the shopping mall's floor plan. The request may contain the rough estimate or the last known good location estimate of location of the mobile station. A mobile device may subsequently receive a response from the location server containing the LCI map and positioning assistance data.

Ahead of time, the location server or other server may derive the positioning assistance data from various maps. Unfortunately, the various map sources provide different and incompatible maps that may be fragmented for a particular venue or LCI. Maps fused into an overall robust and complete merged map better defines the LCI. A better define LCI map allows improved prediction of how a particle may seamless move within and between such maps. Resulting positioning assistance data leads to a more accurate positioning estimate.

Fusing maps from multiple sources provides an improved merged map. The fused maps derived from maps of various sources. These source maps may include one, two or more maps of: (1) a CAD map from venue facilities; (2) a CAD map showing furniture against an outline of the building; (3) a raster map from a venue website; (4) a schematic drawing from a planning department; (5) a vector map from a source; (6) a map from a social check-in service that ties together POI; and (7) an outdoor map showing an outline of a building, for example, from Google Maps, and the like. These source maps provide various levels of resolution, annotation, scale, skew, orientation and accuracy when compared to each other. Merging of such source maps into a fused or merged map having common features allows for a better LCI map.

Systems, methods and apparatus for merging together two or more separate maps representing one LCI are presented. Some example systems, methods and apparatus are provided herein which may be implemented in various devices, such as, e.g., computing platforms and/or mobile devices, to determine or assist in determining that a mobile device is at one or more particular indoor locations.

Maps may be overlapping maps representing the same LCI, such as a map of a mall from two different sources. Maps may be from adjoining LCIs representing a single building, such as a map of two wings of the same building. Maps may include different levels of detail, such as an indoor map and an outdoor map. These variations are described below with reference to the next figures.

FIG. 1 illustrates fusing maps together for a positioning server 140 to generate better assistance data, in accordance with some embodiments of the present invention. A first map 110 from a first source 210 provides a first input to a map fusion unit 100. A second map 120 from a second source 220 provides a second input to the map fusion unit 100. Often the first source 210 and second source 220 provide no coordination. As mentioned above, the first map 110 and the second map 120 provide different levels of resolution, annotation, scale, skew, orientation and accuracy when compared to each other. The first map 110 and the second map 120 often overlap. For example, they both cover the same mall. A first map 110 may cover just a building. A second map 120 may cover the building and adjacent parking structures.

The map fusion unit 100 may detect, compare and line up key features from the maps. The map fusion unit 100 accepts the first map 110 and the second map 120. The map fusion unit 100 detects and strips annotation from the maps. The map fusion unit 100 detects key features from the first map 110 and the second map 120, such as corners and edges. To account for scaling and rotation, the two sets of feature points are scaled and rotation relative to each other to find a match. Once relative scaling and rotation are known, the maps, without annotations, may be directly overlaid on top of one another to result is a merged map 130. Alternatively, dissimilarities or differences are removed and similarities are retained as a merged map 130. The resulting merged map 130 is fed to a positioning server 140. For example, a processor (e.g., processor 610 of FIG. 6) may determine differences between the first map and the second map then send the differences as meta-data to a location based server. The positioning server 140 uses the merged map 130 to generate better positioning assistance data 150 than would have been produced with either the first map 110 or the second map 120.

Figure 2:
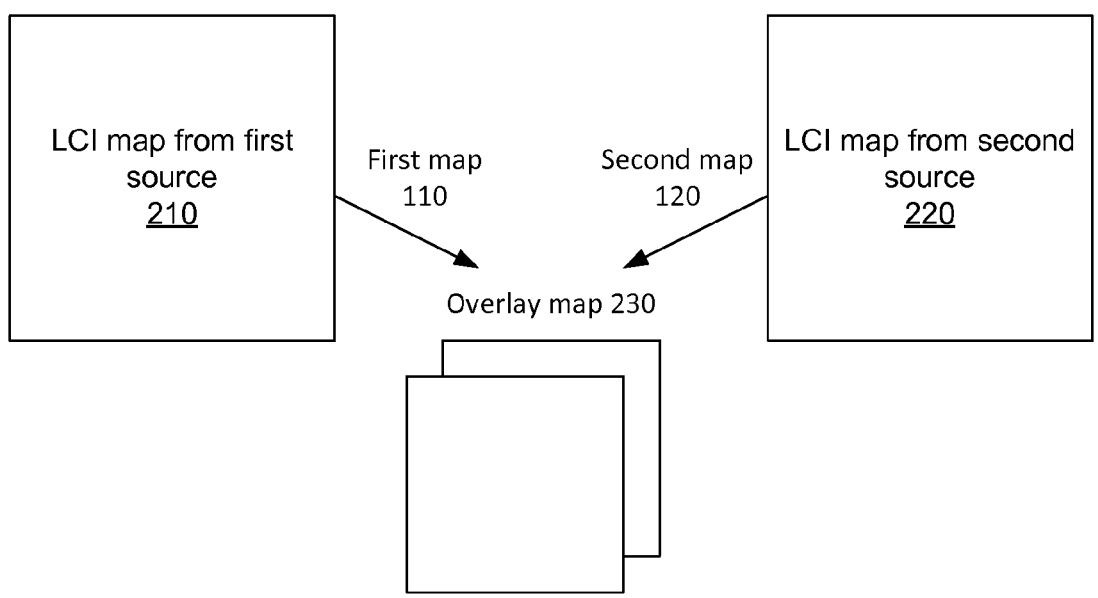
FIG. 2 shows a process to overlay two different maps with similar features representing a common LCI, in accordance with some embodiments of the present invention.

FIG. 2 shows a process to overlay two different maps with similar features representing a common LCI, in accordance with some embodiments of the present invention. A LCI map (such as a first map 110) is provided from a first source 210 and another LCI map (such as a second map 120) is provided from a second source 220. Often the first source 210 and the second source 220 are different and uncoordinated sources. As a result, maps from different sources often provide different levels of resolution, annotation, scale, skew, orientation and accuracy when compared to each other. For example, the second LCI map from the second source 220 is scaled and rotated to match the first LCI map from the first source 210. Office furniture, doors and annotations may be removed then the two maps may be overlaid to result in an overlay map 230. Alternately, dissimilarities may be removed and similarities may be used as the resulting overlay map 230. In addition, maps from three, four and more sources may be similarly combined.

Figure 3:
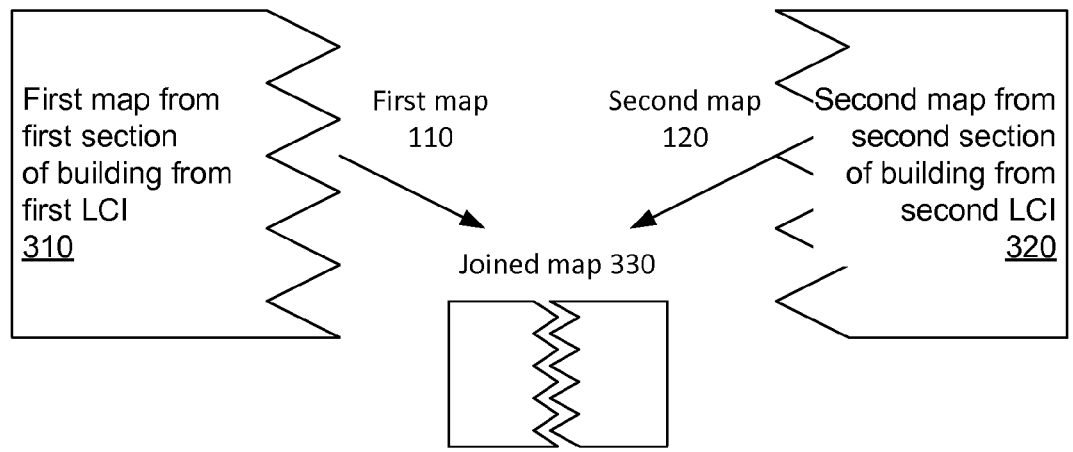
FIG. 3 shows a process to join adjacent maps together, in accordance with some embodiments of the present invention.

FIG. 3 shows a process to join adjacent maps together, in accordance with some embodiments of the present invention. Adjoining LCIs may each include a map of a different section of a common building. The maps from adjoining LCIs may be concatenated into a single resulting map. For example, a first LCI may include a map of an east wing a first floor of a building and a second LCI map include a map of a west wing of the first floor of the same building. The two maps may or may not have the same scale, orientation and resolution. Pattern recognition may be used to find overlapping features. A joined map 330 is formed by finding features along a common edge or common area. For example, a building may include an east wing, a common atrium, and a west wing. In this case, a first map shows the east wing from a first LCI 310 and includes the common atrium and a second map from the west wing from a second LCI 320 also includes the atrium. The atrium acts as a common space found in each LCI map. Features from the common space are arranged over one another such that the maps align. If necessary, the maps are scaled and rotated relative to one another so that key features of the common area overlaps. A joined map 330 is a single map aligned with the maps from the adjacent LCIs.

Figure 4:
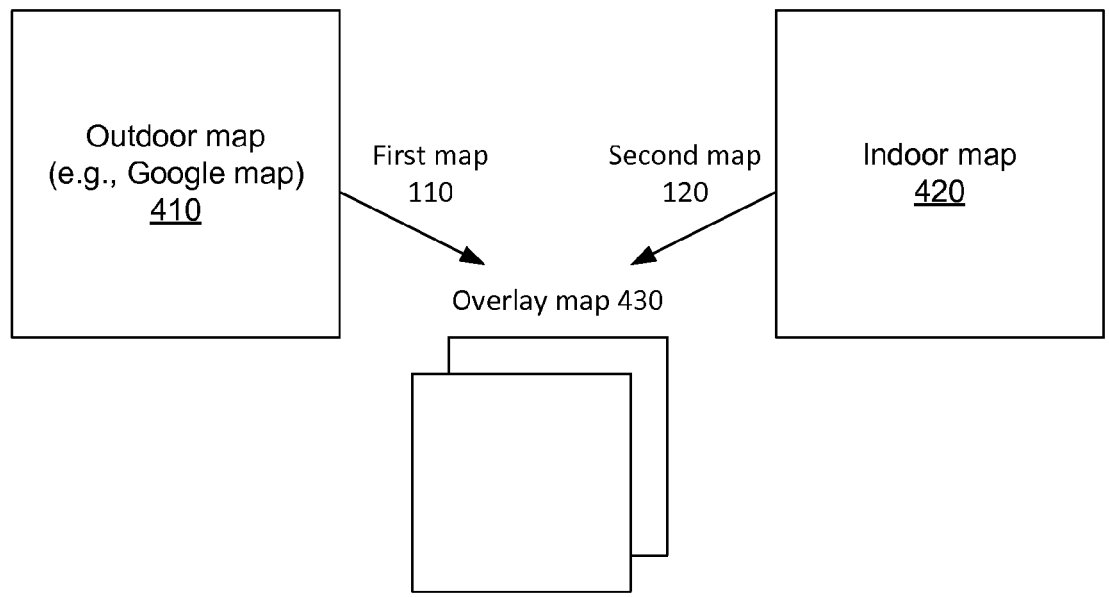
FIG. 4 shows a process to overlay an indoor map on an outdoor map, in accordance with some embodiments of the present invention.

FIG. 4 shows a process to overlay an indoor map 420 on an outdoor map 410, in accordance with some embodiments of the present invention. The process begins with providing an outdoor map 410 (e.g., a Google map) from a first source 210 and an indoor map 420 (e.g., an LCI map) from a second source 220. Build outlines are formed from the outdoor map 410. A single building outline is formed from the indoor map 420. Again, pattern recognition may be used to align and rotate the single building outline formed from the indoor map 420 to a particular one of the one or more building outlines found from the outdoor map 410. The indoor map 420 may be associated with a reference GNSS (global navigation satellite system) position. In this case, the reference GNSS position from the indoor map 420 may be aligned a similar GNSS position on the outdoor map 410. A building in the outdoor map 410 closest to the reference GNSS position may be selected building to insert details from the indoor map 420. The indoor map 420, after scaling and rotation, is then inset into the outdoor map 410 within the selected building outline, thereby forming an overlay map 430. Multiple indoor maps (such as multiple first maps 110) may be inserted within a single outdoor map (such as a second map 120) to form a resulting overlay map 430.

A resulting map formed from an overlap, concatenation or insert between two maps or among three or more maps from different sources may be used by a positioning server 140 to form positioning assistance data. The positioning server 140 may derive the resulting map a priori before the positioning server 140 receives a request for positioning assistance data. That is, a positioning server 140 may combine maps offline in anticipation that a request for that particular positioning data is received.

Figure 5:
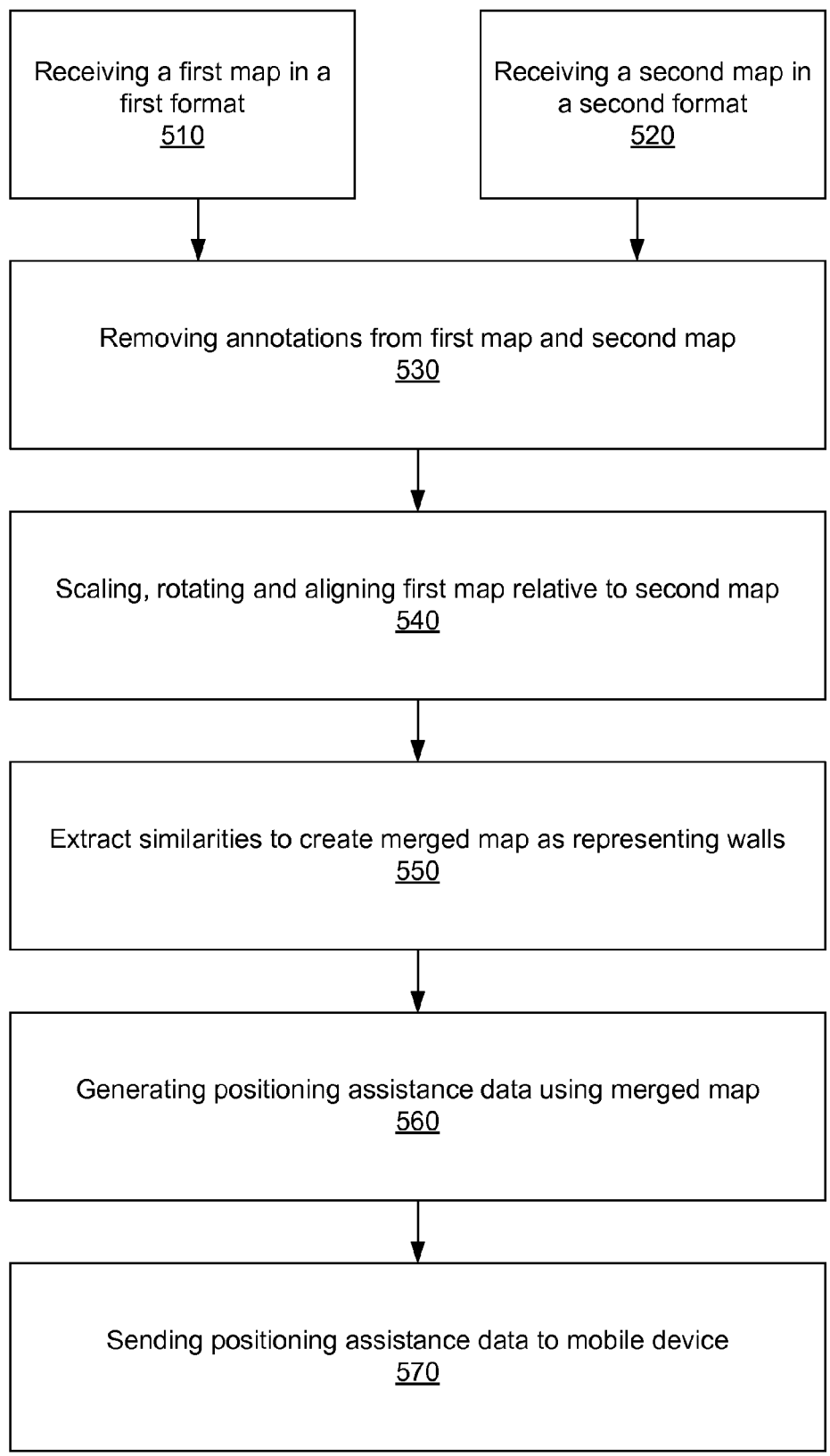
FIG. 5 illustrates a method for merging maps for a positioning server, in accordance with some embodiments of the present invention.

FIG. 5 illustrates a method for merging maps for a positioning server 140, in accordance with some embodiments of the present invention. At 510, a processor (e.g., processor 610 of FIG. 6) receives a first map 110 in a first format. The processor may be a processor of a positioning server 140, a processor couple to a positioning server 140, or the like. At 520, the processor receives a second map 120 of a second format. The first map 110 and the second map 120 are related. For example, the maps overlay one another and represent a common area. The maps may adjoin one another to form a larger map. In other cases, one (or more) maps (e.g., an indoor map 420) may be inserted into another map (e.g., an outdoor map 410). The first map 110 and the second map 120 may come from two different sources: a first source 210 and a second source 220 (e.g., a building maintenance management or a city planning department). The first format may be different than the second format. For example, the first format may be a raster image while the second format may be a vector map. The first map 110 and the second map 120 come from two different sources. The first map 110 and the second map 120 may each include interior walls. Alternatively, one map includes interior walls (e.g., from an LCI map) and the other includes exterior walls (e.g., from a satellite view).

At 530, the processor optionally removes annotations from the first map and from the second map. At 540, the processor scales, rotates and aligns the first indoor map 420 relative to the second indoor map. Often the two maps are not of the same scale or orientation. Therefore, scale and orientation may be adjusted. The processor aligns the first indoor map 420 and the second indoor map with reference to a pivot point. By adjusting scale and alignment with reference to a pivot point, error may be removed before the two maps are aligned.

At 550, the processor determines similarities between the scaled, rotated and aligned maps. Features that are consistent between maps have a higher probability than those that are inconsistent of creating useful assistance data. Dissimilarities may be discarded and only similarities kept.

Extracting similarities may comprise joining the first map to the second map by aligning structures. For example, maps may be of the same building and overlaid on top of one another. Maps may be concatenated with a common line or area of features. Maps may be places one inside the other to form an inset map. The maps may be overlapped. That is, the similarities may be found by overlaying the first map and the second map and then identifying regions with the same wall structures. The maps may be concatenated. For example, the first map may represent a first section of building and the second map may represent a second section of the building, wherein the first section and the second section are different sections of the same building. Steps 510 to 550 may occur offline before a mobile device requests assistances data.

At 560, a processor generates positioning assistance data using the merged map. The positioning assistance data is either generated offline a priori in anticipation of need or live in response to a request from a mobile device. At 570, a processor sends the positioning assistance data to a mobile device in response to a request. The processor(s) to generate and send positioning assistance data may be the same processor as described above. Alternatively, the processor(s) may be a processor of a separate positioning server 140.

Figure 6:
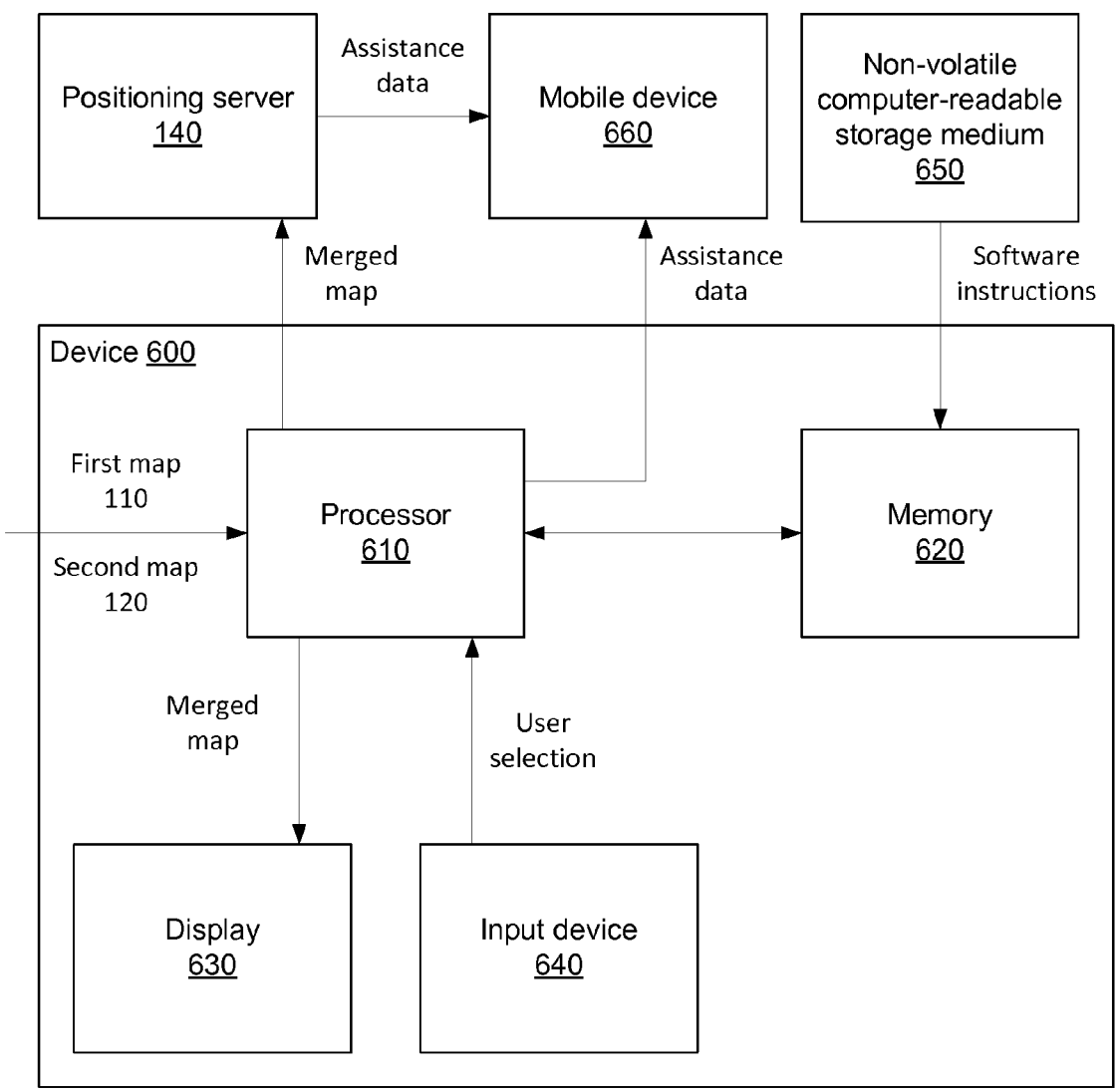
FIG. 6 shows a device for merging maps used by a positioning server to generate assistance data, in accordance with some embodiments of the present invention.

FIG. 6 shows a device for merging maps used by a positioning server 140 to generate assistance data, in accordance with some embodiments of the present invention. The device 600 may be a server, such as a positioning server 140, and contains a processor 610 and memory 620. The device 600 may also contain display 630 and/or an input device 640. The device 600 may be coupled to a non-volatile computer-readable storage medium 650, a mobile device 660 and/or a positioning server 140.

The processor 610 may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. The processor 610 acts as a means for executing code or software instructions to perform the methods described herein. The processor 610 is coupled to the memory 620. The memory 620 may contain code or software instructions, for example, obtained from the non-volatile computer-readable storage medium 650.

The processor 610 receives a first map in a first format and receives a second map in a second format. The processor 610 acts as a means for receiving a first map in a first format and receiving a second map in a second format. The first map and the second map are related but may be in different formats (e.g., one is a raster image and the other is a vector map) and/or from different sources. The first map and the second map may be indoor maps covering a common floor plan of a common building, for example, the same floor plan from difference sources. Similarities between the two floor plans may be considered more permanent in a merge map. Alternatively, the first map and the second map may include two indoor maps covering adjacent floor plans of a common building. For example, the first map may cover the west of a building and the second map may cover the east of the same building. Alternatively, the first map is an outdoor map (that includes an outline of a building) and the second map includes a floor plan of the building. The first map and the second map may be display on the display 630 to a user. The user uses the input device 640 to toggle between the maps.

The processor 610 scales, rotates and aligns the first map relative to the second map. The processor 610 acts as a means for scaling, rotating and aligning the first map relative to the second map. The processor 610 may remove annotations in the first and second maps prior to extracting any similarities. The processor 610 acts as a means for removing annotations in the first map and removing annotations the second map prior to extracting the similarities. The processor 610 extracts similarities between the first map and the second map to form a merged map. The processor 610 acts as a means for extracting similarities between the first map and the second map to form a merged map. Extracting the similarities may comprise overlaying the first map with the second map and identifying regions with same wall structures. Extracting the similarities may comprise joining the first map to the second map by aligning features. Extracting the similarities may comprise determining exterior wall boundaries from the first map comprising an outdoor map, determining exterior wall boundaries from the second map comprising an indoor map, and overlaying the exterior wall boundaries of the second map on the exterior wall boundaries of the first map.

The processor 610 may provide the user with the merged map for viewing on the display 630. The processor 610 may determine differences between the first map and the second map, and then send the differences as meta-data to a location based server (e.g., positioning server 140). The processor 610 may generate positioning assistance data using the merged map, and then may send the positioning assistance data to a mobile device. The processor 610 or the positioning server 140 (e.g., a location server) forms the assistance data using the merged map. The processor 610 or the positioning server 140 sends the assistance data to a mobile device.

The methodologies described herein may be implemented by various means depending upon the application. For example, these methodologies may be implemented in hardware, firmware, software, or any combination thereof. For a hardware implementation, a processor 610 may be implemented.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit (such as processor 610). Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

What is claimed is:

1. A method for merging maps used by a positioning server, the method comprising:
   obtaining a first map in a first format;
   obtaining a second map in a second format different from the first format, wherein the first map and the second map relate to a same venue;
   determining exterior wall boundaries from the first map based on underlying features in the first map and determining exterior wall boundaries from the second map based on underlying features in the second map;
   scaling, rotating and aligning the first map relative to the second map to align or overlay the exterior wall boundaries of the first map with the exterior wall boundaries of the second map based on key features in the first and second maps; and
   forming a merged map based on the scaling, rotating, and aligning.

2. The method of claim 1, wherein the first map and the second map each comprise interior walls.

3. The method of claim 1, wherein the first map and the second map comprise indoor maps covering a common floor plan of a common building.

4. The method of claim 1, wherein the first map and the second map comprise indoor maps covering adjacent floor plans of a common building.

5. The method of claim 1, wherein the first map and the second map relate to the same venue in that:
   the first map is an outdoor map comprising a building; and
   the second map is a floor plan of the building.

6. The method of claim 1, wherein the first map and the second map come from two different sources.

7. The method of claim 1, wherein the first format is a raster image and the second format is a vector map.

8. The method of claim 1, further comprising removing annotations in the first map and removing annotations in the second map prior to forming the merged map.

9. The method of claim 1, wherein the scaling, rotating and aligning comprises aligning similar features in the first and second maps.

10. The method of claim 1, further comprising:
    determining differences between the first map and the second map; and
    sending the differences as meta-data to a location based server.

11. The method of claim 1, further comprising generating positioning assistance data using the merged map.

12. The method of claim 11, further comprising sending the positioning assistance data to a mobile device.

13. A device for merging maps used by a positioning server, the device comprising:
    means for obtaining a first map in a first format;

means for obtaining a second map in a second format different from the first format, wherein the first map and the second map relate to a same venue;

means for determining exterior wall boundaries from the first map based on underlying features in the first map and determining exterior wall boundaries from the second map based on underlying features in the second map;

means for scaling, rotating and aligning the first map relative to the second map to align or overlay the exterior wall boundaries of the first map with the exterior wall boundaries of the second map based on key features in the first and second maps; and means for forming a merged map based, in part, on an output of the means for scaling, rotating, and aligning.

14. The device of claim 13, wherein the first map and the second map each comprise interior walls.

15. The device of claim 13, wherein the first map and the second map comprise indoor maps covering a common floor plan of a common building.

16. The device of claim 13, wherein the first map and the second map comprise indoor maps covering adjacent floor plans of a common building.

17. The device of claim 13, wherein the first map and the second map relate to the same venue in that:

the first map is an outdoor map comprising a building; and the second map is a floor plan of the building.

18. The device of claim 13, wherein the first map and the second map come from two different sources.

19. The device of claim 13, wherein the first format is a raster image and the second format is a vector map.

20. The device of claim 13, further comprising means for removing annotations in the first map and removing annotations in the second map, which functions prior to the means for forming the merged map.

21. A device for merging maps used by a positioning server, the device comprising a processor and a memory wherein the memory includes software instructions to:

obtain a first map in a first format;

obtain a second map in a second format different from the first format, wherein the first map and the second map relate to a same venue;

determine exterior wall boundaries from the first map based on underlying features in the first map and determining exterior wall boundaries from the second map based on underlying features in the second map;

scale, rotate and align the first map relative to the second map to align or overlay the exterior wall boundaries of the first map with the exterior wall boundaries of the second map based on key features; and form a merged map based, in part, on the scaling, rotating and aligning.

22. The device of claim 21, wherein the first map and the second map each comprise interior walls.

23. The device of claim 21, wherein the first map and the second map comprise indoor maps covering a common floor plan of a common building.

24. The device of claim 21, wherein the first map and the second map comprise indoor maps covering adjacent floor plans of a common building.

25. The device of claim 21, wherein the first map and the second map come from two different sources.

26. A non-transitory computer-readable storage medium including program code stored thereon for merging maps used by a positioning server, the non-transitory computer-readable storage medium comprising program code to:

obtain a first map in a first format;

obtain a second map in a second format different from the first format, wherein the first map and the second map relate to a same venue;

determine exterior wall boundaries from the first map based on underlying features in the first map and determining exterior wall boundaries from the second map based on underlying features in the second map;

scale, rotate and align the first map relative to the second map to align or overlay the exterior wall boundaries of the first map with the exterior wall boundaries of the second map based on key features in the first and second maps; and form a merged map based on the scaling, rotating, and aligning.

27. The non-transitory computer-readable storage medium of claim 26, wherein the first map and the second map each comprise interior walls.

28. The non-transitory computer-readable storage medium of claim 26, wherein the first map and the second map comprise indoor maps covering a common floor plan of a common building.

29. The non-transitory computer-readable storage medium of claim 26, wherein the first map and the second map comprise indoor maps covering adjacent floor plans of a common building.

30. The non-transitory computer-readable storage medium of claim 26, wherein the first map and the second map come from two different sources.

\* \* \* \* \*